(12) United States Patent
Kim

(10) Patent No.: US 7,332,397 B2
(45) Date of Patent: Feb. 19, 2008

(54) METHOD FOR FABRICATING SEMICONDUCTOR DEVICE

(75) Inventor: Sang Cheol Kim, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 417 days.

(21) Appl. No.: 11/149,166

(22) Filed: Jun. 10, 2005

(65) Prior Publication Data

US 2006/0211229 A1    Sep. 21, 2006

(30) Foreign Application Priority Data

Mar. 18, 2005  (KR)  ............... 10-2005-0022618

(51) Int. Cl.
*H01L 21/336* (2006.01)

(52) U.S. Cl. ............... 438/268; 438/270; 438/271; 257/E29.201

(58) Field of Classification Search ............. 438/268, 438/270, 271

See application file for complete search history.

(56) References Cited

U.S. PATENT DOCUMENTS

| | | | | |
|---|---|---|---|---|
| 5,610,091 A | * | 3/1997 | Cho | ............... 438/259 |
| 5,780,340 A | * | 7/1998 | Gardner et al. | ............. 438/259 |
| 6,204,128 B1 | * | 3/2001 | Hibi et al. | ................ 438/270 |
| 6,303,448 B1 | * | 10/2001 | Chang et al. | ............... 438/300 |
| 6,693,026 B2 | * | 2/2004 | Kim | ......................... 438/589 |

FOREIGN PATENT DOCUMENTS

| | | |
|---|---|---|
| EP | 0 931 350 B1 | 2/2002 |
| JP | 06021451 A | 1/1994 |
| JP | 2005-19584 A | 1/2005 |
| KR | 1020040003948 A | 1/2004 |
| KR | 1020040008479 A | 1/2004 |
| KR | 1020040102720 A | 12/2004 |

\* cited by examiner

*Primary Examiner*—Thanh Nguyen
(74) *Attorney, Agent, or Firm*—Townsend and Townsend and Crew LLP

(57) ABSTRACT

A method for fabricating a semiconductor device includes forming a doped polysilicon layer on a semiconductor substrate forming an oxide film for device isolation in a predetermined region of the doped polysilicon layer and the semiconductor substrate, forming an etch stop layer on the oxide film for device isolation and the doped polysilicon layer, etching a predetermined region of the etch stop layer, the doped polysilicon layer and the semiconductor substrate to form a trench defining a gate region, depositing a gate oxide film on the gate region, forming a gate electrode layer and a hard mask layer filling the trench, and polishing the gate electrode layer and the hard mask layer to expose the etch stop layer and to form a gate in the gate region.

20 Claims, 6 Drawing Sheets

METHOD FOR FABRICATING SEMICONDUCTOR DEVICE

The present invention claims the benefit of Korean Patent Application No. 2005-0022618 filed in Korea on Mar. 18, 2005, which is hereby incorporated by reference in its entirety.

BACKGROUND OF THE INVENTION

1. Field of the Invention

The present invention generally relates to a semiconductor device, and more specifically, to a method for fabricating a semiconductor device. Although the present invention is suitable for a wide scope of applications, it is particularly suitable for fabricating a device isolation film and a gate line after formation of a doped polysilicon layer on a semiconductor substrate.

2. Description of the Related Art

FIGS. 1a through 1d are cross-sectional views illustrating a related art method for fabricating a semiconductor device. Referring to FIG. 1a, a device isolation film 20 defining an active region is formed on a semiconductor substrate. Referring to FIG. 1b, a stacked structure of a gate oxide film 30, a gate polysilicon layer 40, a gate metal layer 50 and a hard mask layer 60 is then formed on the semiconductor substrate 10 and the device isolation film 20.

A photoresist film (not shown) is deposited on the hard mask layer 60. The photoresist film (not shown) is then exposed and developed to form a photoresist film pattern (not shown) defining a gate region. Thereafter, the stacked structure is etched using the photoresist film pattern as an etching mask to form gate structures 65 that each include a gate oxide film pattern 30a, a gate polysilicon layer pattern 40a, a gate metal layer pattern 50a and a hard mask layer pattern 60a, as shown in FIG. 1c. Thereafter, the photoresist film pattern is removed.

Referring to FIG. 1d, the semiconductor substrate 10 is subjected to an ion implantation process using the gate 65 structures as a mask. Gate spacers 70 are then formed on sidewalls of the gate structures 65. Next, a polysilicon layer is formed to fill up the openings between the gate structures 65 having the gate spacers 70. The polysilicon layer is then subjected to a chemical-mechanical polishing (CMP) process to form polysilicon plugs 80 for contacting to regions of the semiconductor substrate 10.

In accordance with the above-described conventional method, the polysilicon plugs are formed after the device isolation film and the gate line are formed. Accordingly, it is difficult to form the polysilicon plugs, which fill the openings between the gate structures, as the openings are decreased in size when the integration density is increased. Moreover, during an etching process for forming the openings between the gate structures, a surface of the semiconductor substrate may be damaged or the semiconductor substrate may not be completely exposed.

SUMMARY OF THE INVENTION

It is an object of the present invention to provide a method for fabricating a semiconductor device to improve the contact characteristics of the semiconductor device.

Another object of the present invention to provide a method for fabricating a semiconductor device to simplify the fabrication process of the semiconductor device.

In order to achieve the objects of the present invention, there is provided a method for fabricating a semiconductor device that includes forming a doped polysilicon layer on a semiconductor substrate, forming an oxide film for device isolation in a predetermined region of the doped polysilicon layer and the semiconductor substrate, forming an etch stop layer on the oxide film for device isolation and the doped polysilicon layer, etching a predetermined region of the etch stop layer, the doped polysilicon layer and the semiconductor substrate to form a trench defining a gate region, depositing a gate oxide film on the gate region, forming a gate electrode layer and a hard mask layer filling the trench, and polishing the gate electrode layer and the hard mask layer to expose the etch stop layer and to form a gate in the gate region.

In another aspect, a method for fabricating a semiconductor device includes forming a polysilicon layer on a semiconductor substrate, etching a predetermined region of the polysilicon layer and the semiconductor substrate to form a trench for device isolation, forming an oxide film filling the trench for device isolation, forming an etch stop layer on the oxide film and the polysilicon layer, etching a predetermined region of the etch stop layer, the polysilicon layer and the semiconductor substrate to form a trench defining a gate region, depositing a gate oxide film on the gate region, forming a gate electrode layer and a hard mask layer filling the trench, and polishing the gate electrode layer and the hard mask layer to expose the etch stop layer and to form a gate in the gate region.

In another aspect, a method for fabricating a semiconductor device includes forming a doped polysilicon layer on a semiconductor substrate, forming an etch stop layer on the doped polysilicon layer, etching a predetermined region of the etch stop layer, the doped polysilicon layer and the semiconductor substrate to form a trench defining a gate region, depositing a gate oxide film on the gate region, forming a gate electrode layer and a hard mask layer filling the trench, polishing the gate electrode layer and the hard mask layer to expose the etch stop layer and to form a gate in the gate region, forming a first insulating film on the etch stop layer and the gate, and forming a contact plug to the doped polysilicon layer in a predetermined region of the first insulating film and the etch stop layer.

DETAILED DESCRIPTION OF THE EXEMPLARY EMBODIMENTS

Reference will now be made in detail to exemplary embodiments of the present invention. Wherever possible, the same reference numbers will be used throughout the drawings to refer to the same or like parts.

FIGS. 2a through 2d are cross-sectional views illustrating a method for fabricating a semiconductor device according to an embodiment of the present invention.

Figure 1A:
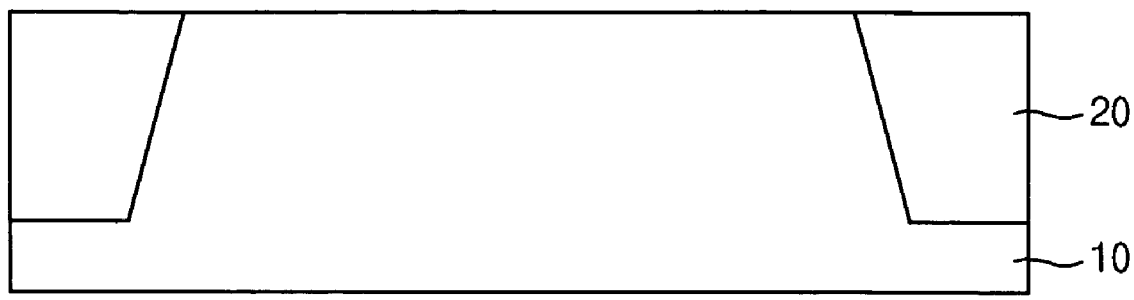
FIGS. 1a through 1d are cross-sectional views illustrating a related art method for fabricating a semiconductor device.
Figure 1B:
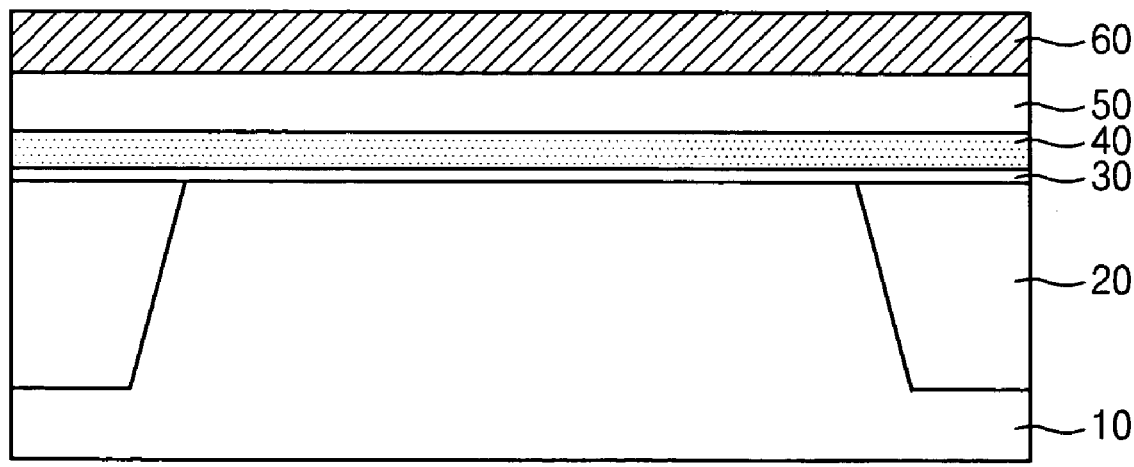
Figure 1C:
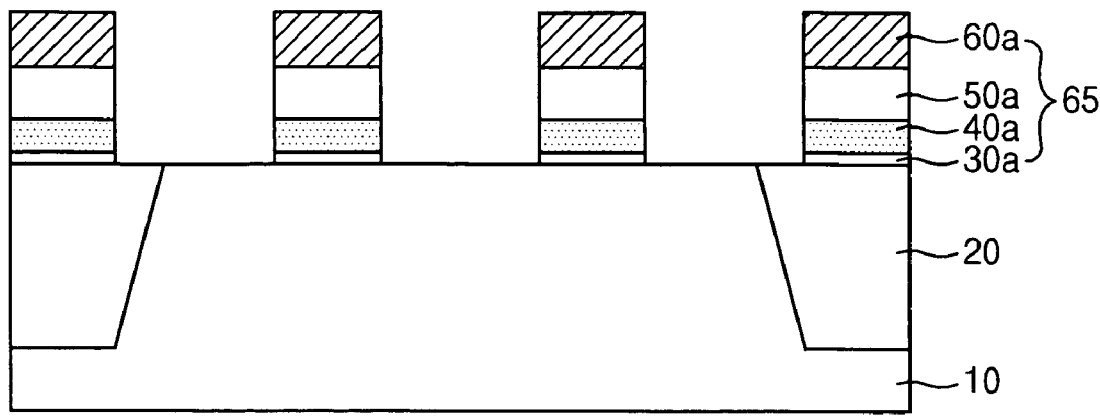
Figure 1D:
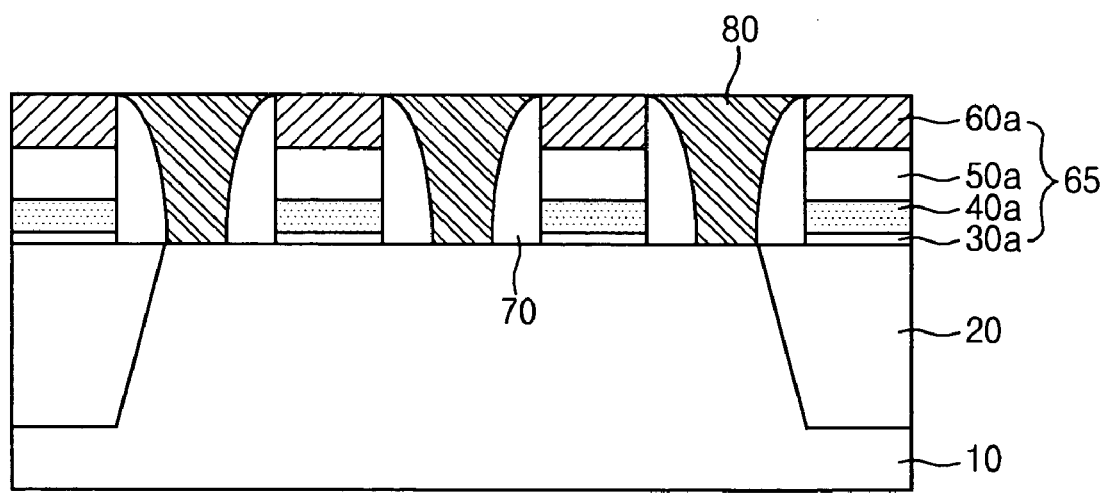
Figure 2A:
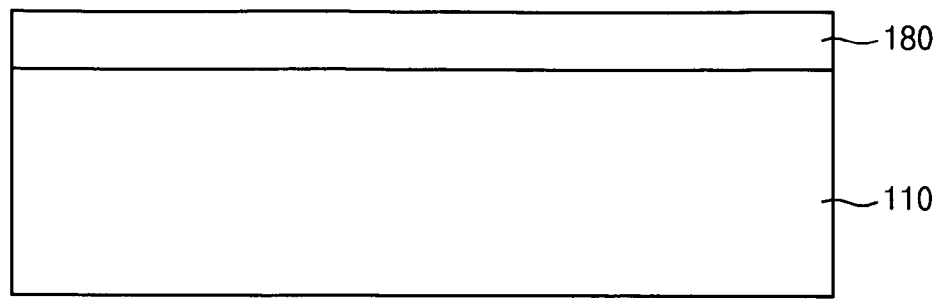
FIGS. 2a through 2i are cross-sectional views illustrating a method for fabricating a semiconductor device according to a preferred embodiment of the present invention.

Referring to FIG. 2a, an undoped polysilicon layer 180 is formed on a semiconductor substrate 110.

Figure 2B:
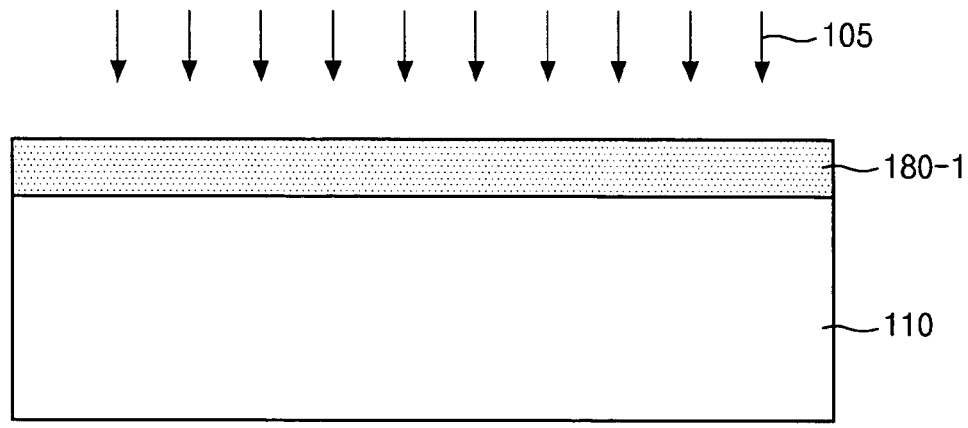

Referring to FIG. 2b, the undoped polysilicon layer 180 is subjected to an ion implantation process to implant impurities into the polysilicon layer 180 to form a doped polysilicon layer 180-1. Preferably, the impurities are P, As or combination thereof. Thereafter, a heat treatment process may be performed on the doped polysilicon layer 180-1 to activate the impurities so that portions of the doped polysilicon layer 180-1 may serve as source/drain regions. In the alternative, the doped polysilicon layer 180-1 may be formed using a Si source gas and an impurity source gas, so that a polysilicon layer is deposited that is inherently doped during the formation process of the polysilicon layer.

Figure 2C:
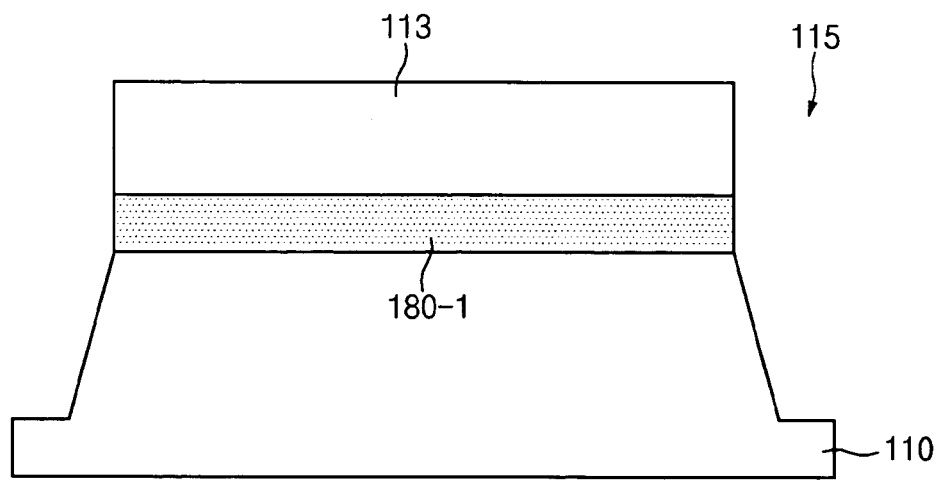

Referring to FIG. 2c, a photoresist film (not shown) is deposited on the doped polysilicon layer 180-1. The photoresist film (not shown) is then exposed and developed to form a first photoresist pattern 113 exposing a predetermined region of the doped polysilicon layer 180-1 where a device isolation film is to be formed. Thereafter, the predetermined region of the doped polysilicon layer 180-1 and the semiconductor substrate 110 are etched using the first photoresist film pattern 113 as an etching mask to form a trench 115 defining a device isolation region.

Figure 2D:
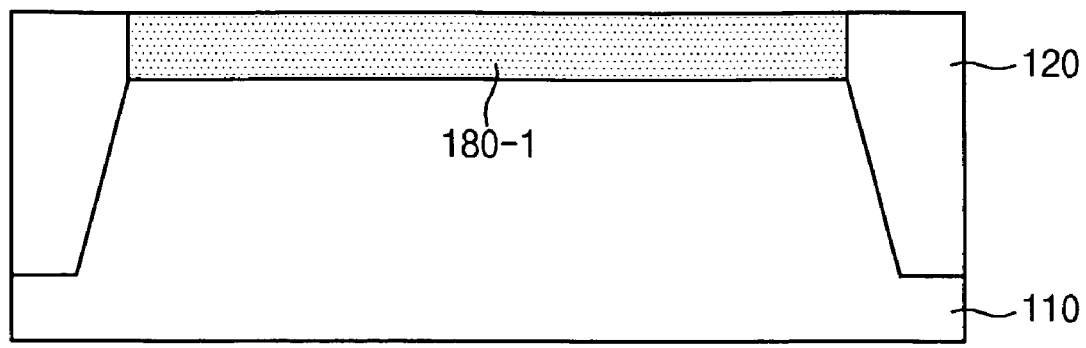

Referring to FIG. 2d, the first photoresist film pattern 113 is removed. Thereafter, an oxide film (not shown) filling the trench 115 is formed. Next, the oxide film (not shown) is subjected to a CMP process until the doped polysilicon layer 180-1 is exposed to form a device isolation film 120.

Figure 2E:
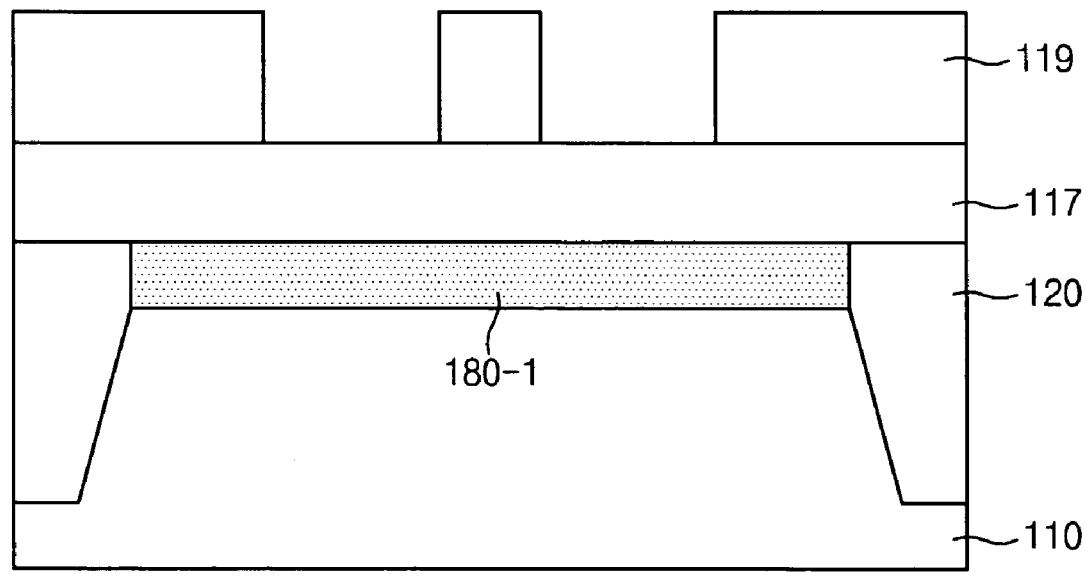

Referring to FIG. 2e, an etch stop layer 117 is formed on the device isolation film 120 and the doped polysilicon layer 180-1. Thereafter, a photoresist film (not shown) is deposited on the etch stop layer 117. The photoresist film (not shown) is then exposed and developed to form a second photoreist film pattern 119 exposing a predetermined gate region of the etch stop layer 117.

Figure 2F:
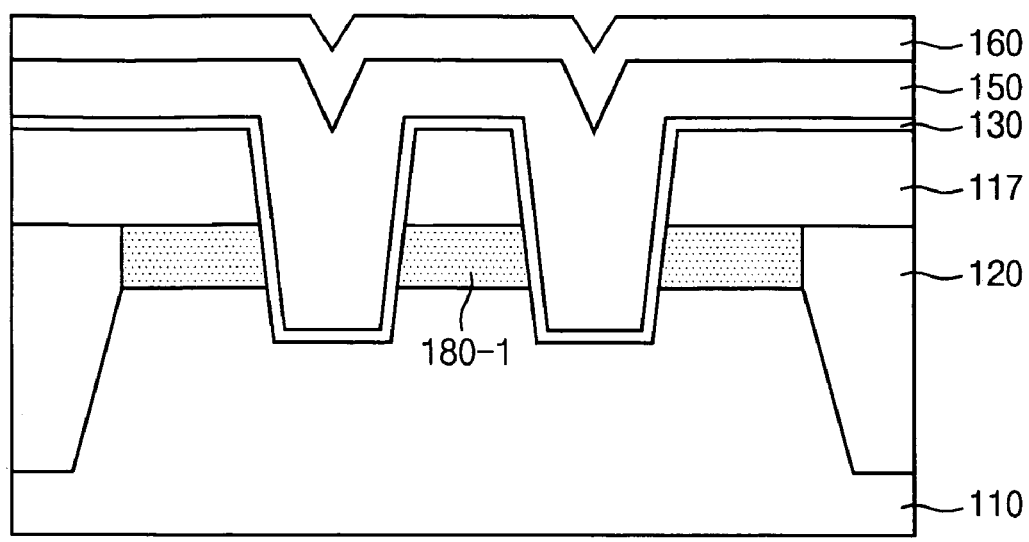
Figure 2G:
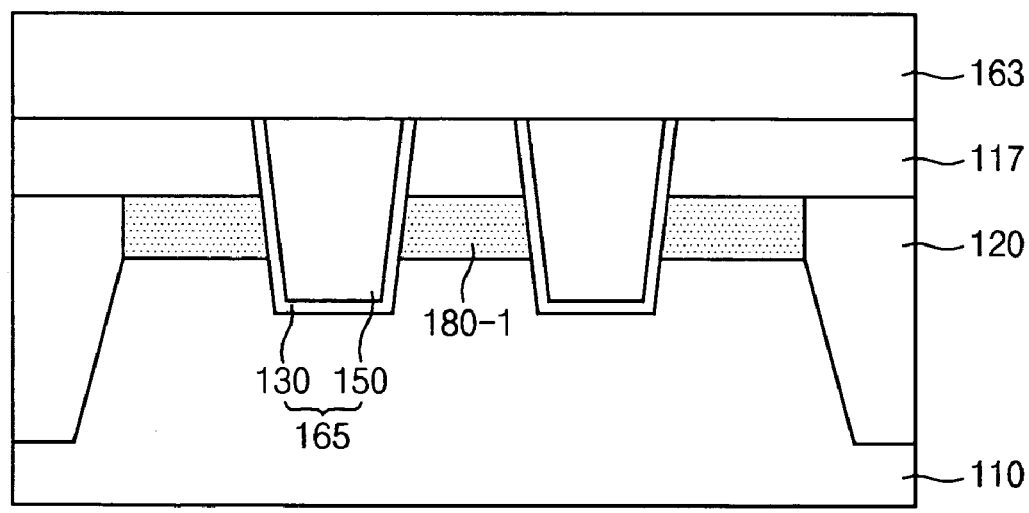
Figure 2H:
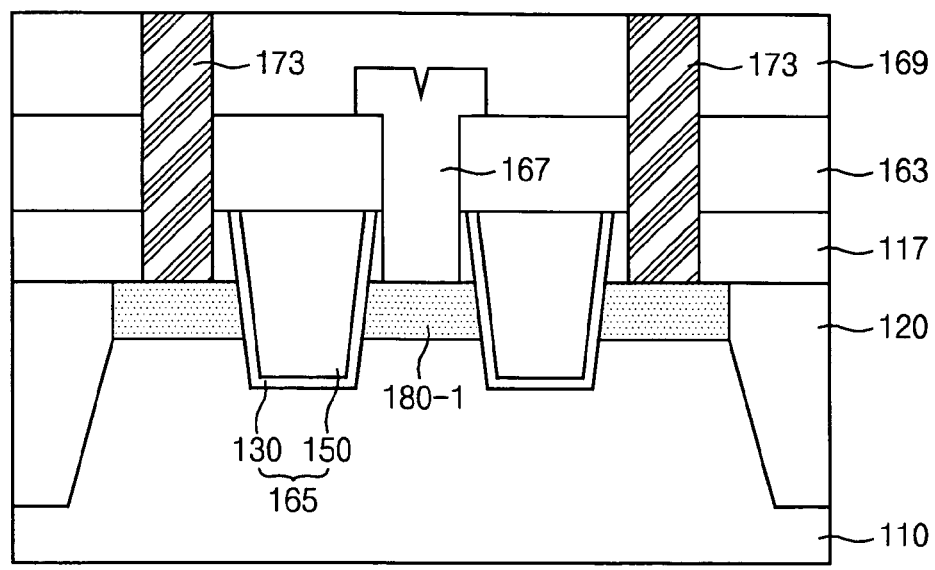

Referring to FIG. 2f, the predetermined gate region of the etch stop layer 117, the doped polysilicon layer 180-1 and the semiconductor substrate 110 are etched to form a trench (not shown) defining a gate region. Next, a gate oxide film 130 is deposited on the entire surface, including the gate region. A gate electrode layer 150 and a hard mask layer 160 for filling the trench, which defines the gate region, are then sequentially deposited on the gate oxide film 130. Preferably, the gate electrode layer 150 includes a stacked structure of a gate polysilicon layer (not shown) and a gate metal layer (not shown). The gate metal layer can include a metal selected from the group consisting of W, Co, Ta, Mo, Hf, Nb, V, Zr, silicide thereof and combinations thereof.

Referring to 2g, a CMP process is performed until the etch stop layer 117 is exposed to form gates 165 in the gate region. Here, the doped polysilicon layer 180-1 serves as source/drain regions. Thus, the source/drain regions are simultaneously formed while the gate 165 is formed. Next, a first insulating film 163 is formed on the entire surface of the etch stop layer 117 and the gate 165.

Referring to 2h, a predetermined region of the first insulating film 163 and the etch stop layer 117 is etched to form a bit line contact hole (not shown). Next, a polysilicon layer (not shown) filling the bit line contact hole (not shown) is formed on the entire surface of the insulating film 163. The polysilicon layer is then selectively etched using a bit line mask (not shown) to form a bit line contact plug 167 to the polysilicon 180-1. Thereafter, a second insulating film 169 is formed on the first insulating film 163 and the bit line contact plug 167. Next, a predetermined region of the second insulating film 169, the first insulating film 163 and the etch stop layer 117 is sequentially etched to form a storage node contact hole (not shown).

A polysilicon layer (not shown) filling the storage node contact hole (not shown) is then formed on the entire surface of the resulting structure. Thereafter, the polysilicon layer is subjected to an etch-back process or a CMP process until the second insulating film 169 is exposed to form a storage node contact plug 173.

Figure 2I:
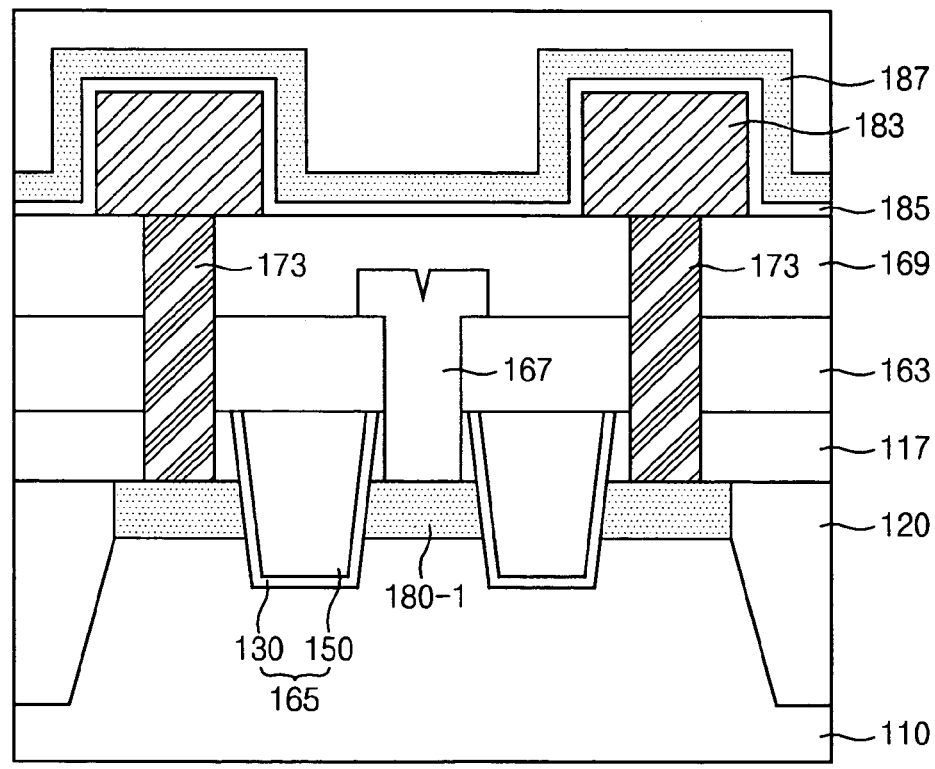

Referring to FIG. 2i, a lower electrode layer for capacitor (not shown) is formed on the second insulating film 169 and the storage node contact plug 173, and then etched to form a lower electrode layer pattern 183. Thereafter, a dielectric film 185 and an upper electrode layer 187 for capacitor are sequentially deposited on the second insulating film 169 and the lower electrode layer pattern 183 to form a capacitor. The subsequent process may be done by known semiconductor fabrication processes.

As described above, the method for fabricating a semiconductor device in accordance with embodiments of the present invention provides an improved junction characteristic for a contact plug by forming the device isolation film and the gate line after the formation of the doped polysilicon layer on the semiconductor substrate. Accordingly, a mask process for polysilicon plug contact is not required, so that the fabrication process is simplified.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A method for fabricating a semiconductor device, comprising:

forming a doped polysilicon layer on a semiconductor substrate;

forming an oxide film for device isolation in a predetermined region of the doped polysilicon layer and the semiconductor substrate;

forming an etch stop layer on the oxide film for device isolation and the doped polysilicon layer;

etching a predetermined region of the etch stop layer, the doped polysilicon layer and the semiconductor substrate to form a trench defining a gate region;

depositing a gate oxide film on the gate region;

forming a gate electrode layer and a hard mask layer filling the trench; and polishing the gate electrode layer and the hard mask layer to expose the etch stop layer and to form a gate in the gate region.

2. The method according to claim 1, wherein the polishing is chemical-mechanical polishing.

3. The method according to claim 1, wherein forming a doped polysilicon layer on a semiconductor substrate comprises:

forming an undoped polysilicon layer on the semiconductor substrate; and performing an ion implantation process on the undoped polysilicon layer.

4. The method according to claim 1, wherein forming a doped polysilicon layer on a semiconductor substrate comprises:

forming the doped polysilicon layer using a Si source gas and an impurity source gas.

5. The method according to claim 1, wherein the gate electrode layer comprises a stacked structure of a gate polysilicon layer and a gate metal layer.

6. The method according to claim 5, wherein the gate metal layer comprises a metal selected from the group consisting of W, Co, Ta, Mo, Hf, Nb, V, Zr, silicide thereof and combinations thereof.

7. The method according to claim 1, further comprising:
forming a first insulating film on the etch stop layer and the gate;
forming a bit line contact plug to the doped polysilicon layer in a predetermined region of the first insulating film and the etch stop layer;
forming a second insulating film on the first insulating film including the bit line contact plug;
forming a storage node contact plug in a predetermined region of the second insulating film, the first insulating film and the etch stop layer;
forming a lower electrode layer on the second insulating film and the storage node contact plug; and
depositing a dielectric layer and an upper electrode layer over the lower electrode layer to form a capacitor.

8. A method for fabricating a semiconductor device, comprising:
forming a polysilicon layer on a semiconductor substrate;
etching a predetermined region of the polysilicon layer and the semiconductor substrate to form a trench for device isolation;
forming an oxide film filling the trench for device isolation;
forming an etch stop layer on the oxide film and the polysilicon layer;
etching a predetermined region of the etch stop layer, the polysilicon layer and the semiconductor substrate to form a trench defining a gate region;
depositing a gate oxide film on the gate region;
forming a gate electrode layer and a hard mask layer filling the trench; and
polishing the gate electrode layer and the hard mask layer to expose the etch stop layer and to form a gate in the gate region.

9. The method according to claim 8, wherein the polysilicon is a doped polysilicon having impurities selected from the group consisting of P, As and a combination thereof.

10. The method according to claim 8, wherein forming a polysilicon layer on a semiconductor substrate comprises:
forming an undoped polysilicon layer on the semiconductor substrate; and
performing an ion implantation process on the undoped polysilicon layer.

11. The method according to claim 8, wherein forming a polysilicon layer on a semiconductor substrate comprises:
forming a doped polysilicon layer using a Si source gas and an impurity source gas.

12. The method according to claim 8, wherein the gate electrode layer comprises a stacked structure of a gate polysilicon layer and a gate metal layer.

13. The method according to claim 12, wherein the gate metal layer comprises a metal selected from the group consisting of W, Co, Ta, Mo, Hf, Nb, V, Zr, silicide thereof and combinations thereof.

14. The method according to claim 8, wherein the polishing is chemical-mechanical polishing.

15. The method according to claim 8, further comprising:
forming a first insulating film on the etch stop layer and the gate;
forming a bit line contact plug to the doped polysilicon layer in a predetermined region of the first insulating film and the etch stop layer;
forming a second insulating film on the first insulating film including the bit line contact plug;
forming a storage node contact plug in a predetermined region of the second insulating film, the first insulating film and the etch stop layer;
forming a lower electrode layer on the second insulating film and the storage node contact plug; and
depositing a dielectric layer and an upper electrode layer over the lower electrode layer to form a capacitor.

16. A method for fabricating a semiconductor device, comprising:
forming a doped polysilicon layer on a semiconductor substrate;
forming an etch stop layer on the doped polysilicon layer;
etching a predetermined region of the etch stop layer, the doped polysilicon layer and the semiconductor substrate to form a trench defining a gate region;
depositing a gate oxide film on the gate region;
forming a gate electrode layer and a hard mask layer filling the trench;
polishing the gate electrode layer and the hard mask layer to expose the etch stop layer and to form a gate in the gate region;
forming a first insulating film on the etch stop layer and the gate; and
forming a contact plug to the doped polysilicon layer in a predetermined region of the first insulating film and the etch stop layer.

17. The method according to claim 16, wherein the polishing is chemical-mechanical polishing.

18. The method according to claim 16, wherein forming a doped polysilicon layer on a semiconductor substrate comprises:
forming an undoped polysilicon layer on the semiconductor substrate; and
performing an ion implantation process on the undoped polysilicon layer.

19. The method according to claim 16, wherein forming a doped polysilicon layer on a semiconductor substrate- comprises:
forming the polysilicon layer using a Si source gas and an impurity source gas.

20. The method according to claim 16, wherein the gate electrode layer comprises a stacked structure of a gate polysilicon layer and a gate metal layer.

* * * * *